(12) United States Patent
Chudzik et al.

(10) Patent No.: US 6,579,759 B1
(45) Date of Patent: Jun. 17, 2003

(54) FORMATION OF SELF-ALIGNED BURIED STRAP CONNECTOR

(75) Inventors: Michael Patrick Chudzik, Beacon, NY (US); Jochen Beintner, Wappingers Falls, NY (US); Ramachandra Divakaruni, Ossining, NY (US); Rajarao Jammy, Wappingers Falls, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 10/227,396

(22) Filed: Aug. 23, 2002

(51) Int. Cl.$^7$ ........................................... H01L 21/8242
(52) U.S. Cl. ..................... 438/249; 438/270; 438/589
(58) Field of Search ................. 438/243, 244, 438/246, 247, 248, 249, 270, 389, 390, 391, 392, 589

(56) References Cited

U.S. PATENT DOCUMENTS

| | | | | |
|---|---|---|---|---|
| 6,222,218 B1 | * | 4/2001 | Jammy et al. | 257/301 |
| 6,406,970 B1 | * | 6/2002 | Kudelka et al. | 438/246 |
| 6,414,347 B1 | * | 7/2002 | Divakaruni et al. | 257/296 |
| 6,432,774 B2 | * | 8/2002 | Heo et al. | 438/270 |

* cited by examiner

Primary Examiner—Chandra Chaudhari
(74) Attorney, Agent, or Firm—Eric W. Petraske

(57) ABSTRACT

In a vertical-transistor DRAM cell, the problem of making a reliable electrical connection between the node of the deep trench capacitor and the lower electrode of the vertical transistor is solved by; depositing a temporary insulator layer, forming a vertical spacer on the trench walls above the temporary insulator, then stripping the insulator to expose the substrate walls; diffusing dopant into the substrate walls to form a self-aligned extension of the buried strap; depositing the final gate insulator; and then forming the upper portion of the DRAM cell.

10 Claims, 2 Drawing Sheets

FORMATION OF SELF-ALIGNED BURIED STRAP CONNECTOR

TECHNICAL FIELD

The field of the invention is that of forming three-dimensional structures in integrated circuit processing, in particular DRAM cells and other structures involving vertical transistors.

BACKGROUND OF THE INVENTION

State of the art Trench capacitor DRAMs use cells with vertical transistors in order to reduce space by stacking the transistor generally above the capacitor and to avoid problems with scaling the pass transistor.

Since the trench capacitor center electrode is located in the trench that also holds the transistor gate, the current path through the transistor body must extend transversely outside the trench and into the semiconductor substrate.

In the case of stacked capacitor cells with buried bitlines or in the case of buried wiring levels below vertical transistors, the current path must similarly extend transversely outside the trench carrying the buried bitline or wiring level.

Prior art methods of introducing dopants into the substrate have involved outdiffusing from a heavily doped layer of poly (the inner electrode) and heating the wafer to drive the dopant into the substrate. As dimensions shrink, the inevitable manufacturing process fluctuations result in a greater percentage variation in vertical height between the capacitor and the transistor. At the same time, reduction in ground rules requires closer lateral spacing between cells and prevents the use of an increased dopant outdiffusion to provide a reliable current path.

SUMMARY OF THE INVENTION

The invention relates to a method of making a three-dimensional electrical structure making contact between two circuit elements that are separated vertically and horizontally.

A feature of the invention is the diffusion of dopant from an aperture cut into a semiconductor substrate, thereby extending a conductive path laterally into the substrate.

Another feature of the invention is the opening of a diffusion window in the sidewall of a trench for entry of dopant to form a self-aligned conductive path.

Another feature of the invention is the use of a temporary spacer to provide the correct vertical location for a hardmask formed on the interior of a trench.

Yet another feature of the invention is the use of a temporary layer to define a diffusion window for diffusion of dopant into the substrate to form a self-aligned extension of the buried strap in a DRAM cell having a vertical transistor.

Yet another feature of the invention is the formation of a diffusion window for diffusion of a dopant into the (single crystal) substrate to form a self-aligned extension of a dopant in the substrate with vertical transistors and buried bitline or wiring level.

DETAILED DESCRIPTION

Figure 1:
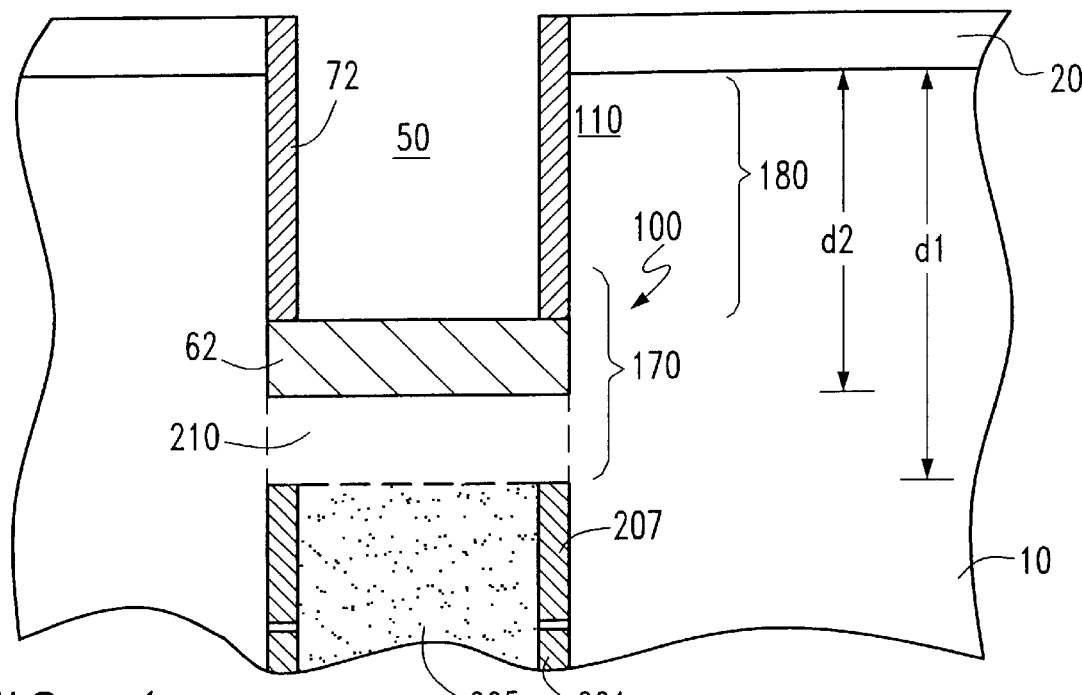
FIGS. 1 through 4 show in cross section of a partially pictorial, partially schematic drawing a portion of a DRAM cell constructed according to the invention.

FIG. 1 shows in cross section a portion of a semiconductor substrate 10 that will hold a DRAM cell, denoted generally by numeral 100, to be formed in a p-type semiconductor substrate 10, which may be silicon, SiGe, GaAs or other semiconductor. A bulk substrate is shown for convenience, but the invention may also be practiced with layered substrates, such as silicon on insulator. An aperture (deep trench) 50, having aperture sidewalls and a vertical aperture axis has been etched through conventional pad layers 20 into substrate 10, e.g. to a depth of about 5 $\mu$m to 10 $\mu$m and a capacitor has been formed in the trench, according to standard practice.

Polysilicon center electrode 205 is one electrode of the capacitor, substrate 10 being the other. Dielectric 207 is the collar. The collar is generally formed above the trench capacitor and is made of oxide. The dielectric between the top electrode 205 and substrate 10 is denoted with numeral 201 below collar 207. Those skilled in the art will appreciate that dielectric 201 is much smaller in width than dielectric 207, but the Figure is shown schematically for clarity in presenting the essential features of the invention. In the case of a buried bitline or wiring level, the buried bitline or wiring would be connected to electrode 205. Illustratively, electrode 205, referred to as a lower electrode, is formed from polycrystalline silicon (poly) or amorphous silicon, doped $N^+$ and dielectric 201 is an nitrided oxide layer or other layer suitable for use as a capacitor dielectric.

The connection of the center electrode to the substrate 10 to form a junction below the vertical transistor is called the buried strap. It may be formed either by recessing the electrode 205 to a depth d1 as shown in FIG. 1, removing the collar 207 by a wet or dry etch, filling the trench with poly 210 and recessing to a depth d2. More commonly, the strap is formed by recessing the poly 205 to a depth d2, aggressively etching (by a wet etch) the collar oxide 207 and filling the gap 212 thus created by a "divot fill" of poly forming a divot strap.

FIG. 1 shows the cell after the formation of buried strap 210 and before the formation of an insulator separating the capacitor from the vertical transistor and the formation of the transistor.

The problem addressed by the present invention is that a reliable conductive path is required between the center electrode and the vertical transistor that will be built in the location indicated vertically by bracket 180. The location of the body of the transistor is indicated by the numeral 110. The area where the path will be formed in substrate 10 is indicated by bracket 170.

It is necessary that the outdiffusion of dopant from the strap diffuses sufficiently to form a good overlap with the gate oxide of the vertical gate transistor. As the vertical transistor scales, the Trench Top Oxide that separates the vertical transistor from the strap is reduced in thickness in order to permit this overlap. The decrease in thickness is limited by reliability considerations, so that there may be an open circuit when the dopant does not extend far enough vertically.

A sacrificial, or temporary, insulator 62, illustratively oxide, has been deposited on the bottom of aperture 50 to a nominal thickness of 30 nm. A nitride ($Si_3N_4$) spacer 72 has been formed on the aperture walls above layer 62 to a nominal thickness of 10 nm. The function of layer 62 is to reserve a portion of the trench sidewalls for diffusion of dopant into silicon substrate 10, the diffusion being blocked in other locations by spacer 72, which also functions as a diffusion mask.

Figure 2:
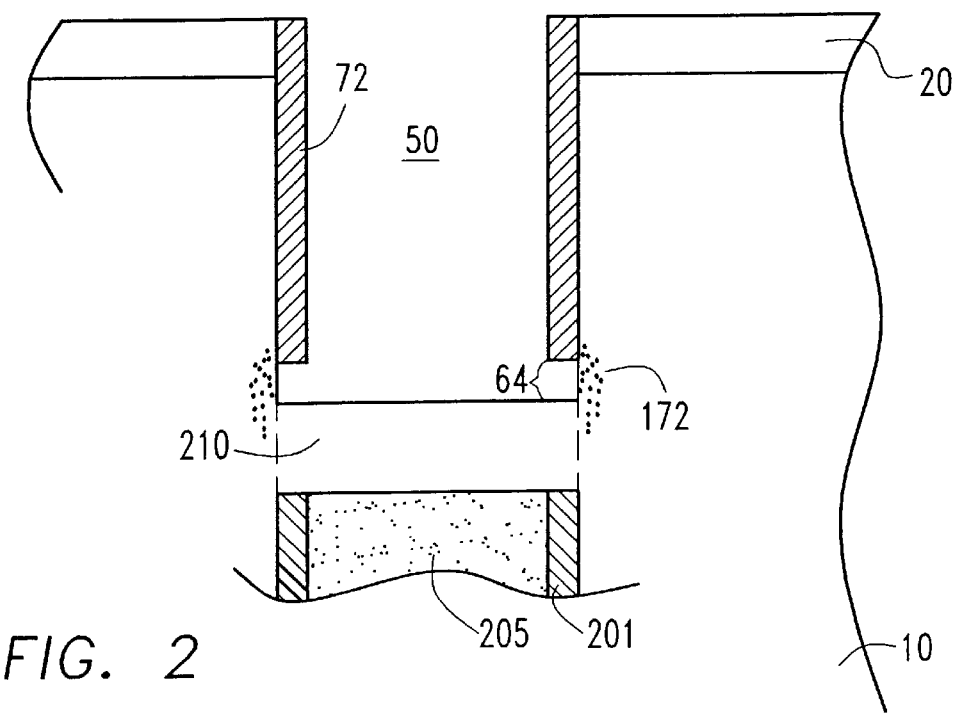

Referring to FIG. 2, the same area is shown after layer 62 has been removed in a conventional wet or dry etch, leaving a portion of the sidewalls exposed having a vertical dimension denoted with bracket 64. The dopant species is Arsenic or Phosphorous. The height of the space 64 is nominally 50 nm. A speckled area 172 indicates where dopant has diffused into the substrate. Preferably, a conventional Gas Phase Diffusion process is used. Another process in which a doped layer of poly is deposited and the wafer is heated, driving the dopant into the substrate could be used, but the gas process is preferred because it is cheaper and easier to control.

The function of doped area 172 is to provide a self-aligned link between buried strap 210 and transistor body 110. Since the transistor body is defined by the top edge of TTO 65 along the trench wall (which was the bottom edge of spacer 72). It is to be noted that the eventual trench top oxide 65 has, in the worst case of tolerance fluctuations of the film, a greater thickness than the sacrificial film 62; i.e. there will be a notch with a bottom notch surface abutting the bottom of spacer 72 and there will be a TTO top surface at a higher level than the notch bottom surface. This guarantees an overlap of the vertical transistor independent of the outdiffusion of the dopants from the strap.

The definition of the transistor body at that height results because the gate oxide is grown in the space vacated by spacer 72 and the transistor gate is conformally deposited in the space left between the TTO and the gate oxide, the lower edge of the transistor body is self-aligned with the top of the diffusion window. Thus, the dopant diffused in through space 64 forms a doped area that provides a current path between the buried strap and the transistor body. The area 172 can be referred to as the lower transistor electrode, since it is adjacent to the transistor body on the lower side. Those skilled in the art will be aware that the dopant will diffuse vertically as well as horizontally, so that there will be a small vertical extension past the edge of the window 64. Since there is no external contact made to this area, which is internal to the cell, it makes no difference if a line is drawn between the lower electrode and the conductive path to the buried strap they merge.

The result is that the inventive process provides a reliable connection between center electrode 205 and the pass transistor of DRAM cell 100.

Figure 3:
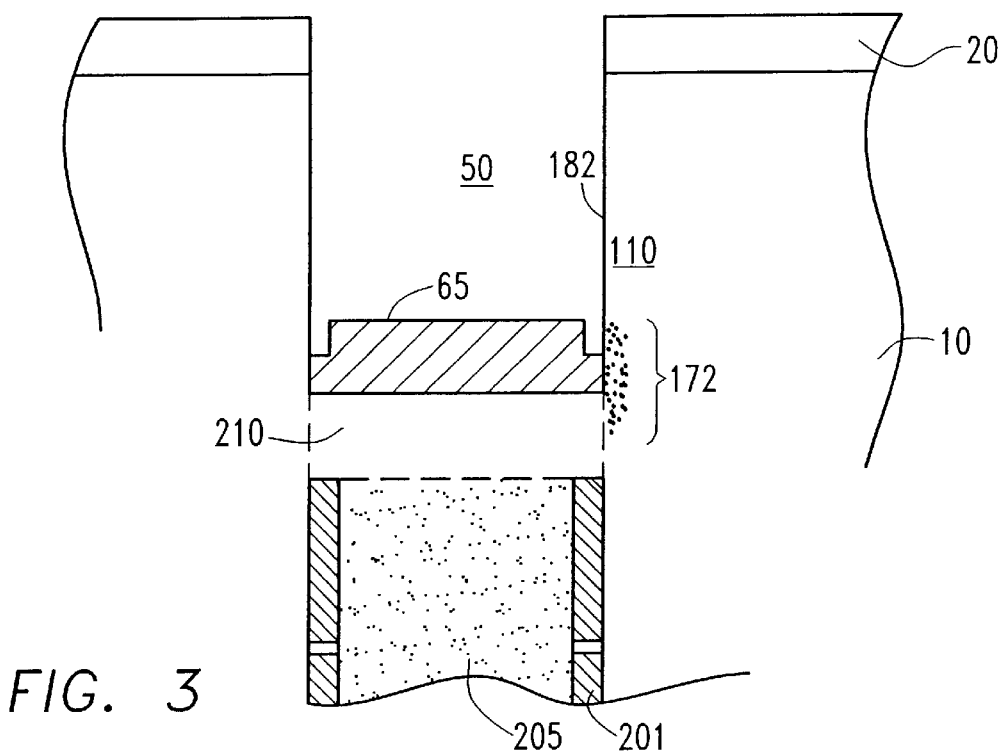

After the diffusion, a final insulating layer, generally referred to as Trench Top Oxide 65 is deposited and spacer 72 is stripped. Note that the final Trench Top Oxide can be a combination of conventional LPTEOS oxide which is conformal (and hence fills the gap under the spacer 72) and a High Density Plasma (HDP) oxide, which is not very conformal. The oxide on the sidewall of the spacer 72 is then stripped before the spacer 72 itself is removed to provide the structure with a notch as shown in FIG. 3. A layer of thermal gate oxide 182, 4–6 nm thick, is grown on the walls of the trench in preparation for completing vertical transistor 100. The result is shown in FIG. 3. The dopant diffused through space 64 functions as the lower electrode of the transistor. The transistor body starts where the gate oxide starts—at the top edge of the portion of TTO 65 in contact with the silicon. Notches can be seen on either side of layer 65, indicating the greater thickness of the spacer compared with the gate oxide and also indicating that the thickness of layer 65 is not critical. The function of layer 65 is to provide isolation between the transistor gate that will be formed in the top portion of aperture 50 and buried strap 210.

Figure 4:
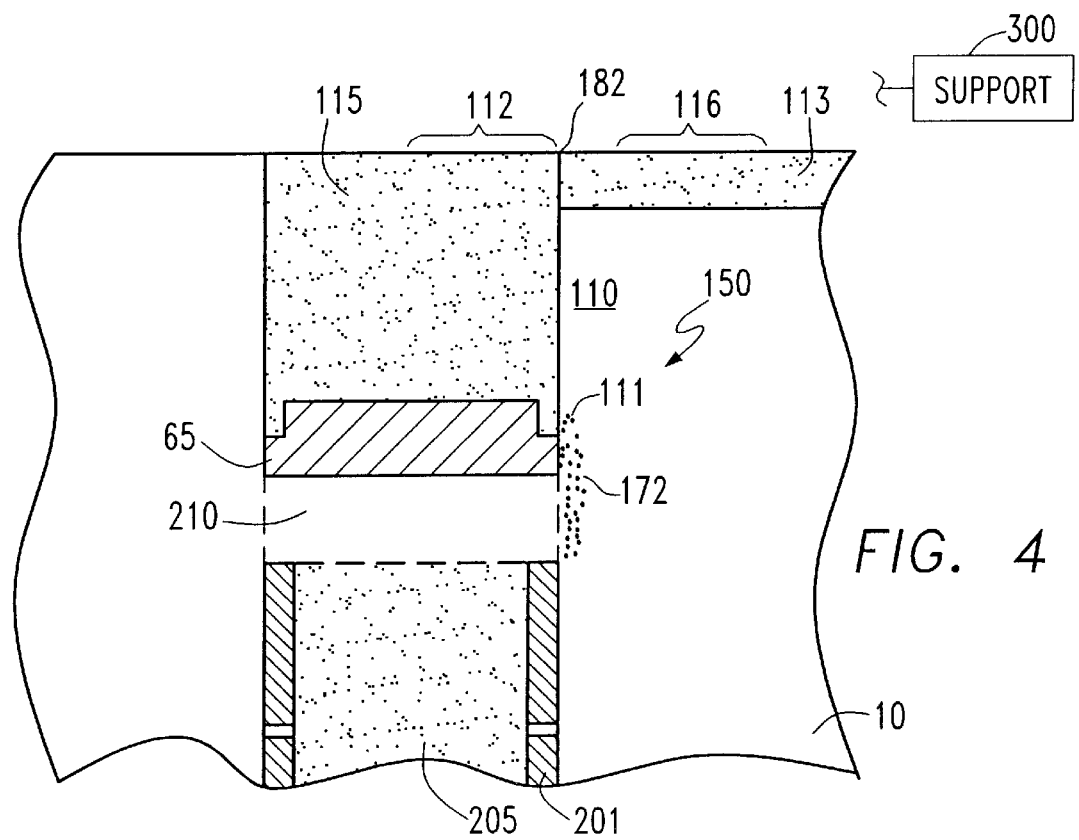

FIG. 4 shows a completed cell, in which transistor 150 has gate 115 formed in the upper portion of the trench, upper electrode 113 and lower electrode 111 are on opposite sides of body 110, the body being separated from the gate by insulator 182. Layer 65 separates gate 115 and buried strap 210. Brackets 112 and 116 indicate places where contacts will be formed in later steps. A conductive path denoted with numeral 172 permits passage of electrons through buried strap 210 in and out of center electrode 205. Those skilled in the art will appreciate that this invention may also be practiced in an arrangement such as that shown in U.S. Pat. No. 6,414,347, incorporated by reference, and with other variations of transistor formation.

Illustratively, the cell illustrated is part of a DRAM array that is connected to other portions of a circuit. Box 300 represents schematically the remainder of an integrated circuit. For example, if the circuit is a DRAM, then box 300 will represent the support circuitry (input/output, charge pumps, redundant portions, etc.). If the circuit is a logic circuit containing an embedded DRAM array, then box 300 will also represent the other functions of the circuit.

In an alternative embodiment, oxide 62 is thicker than the final Trench Top oxide 65. In this case, there is no notch in FIGS. 3 and 4, but as long as oxide 65 is thick enough to ensure reliability of the film and oxide 62 is thicker than 65 in all tolerance cases, the self alignment of the strap is maintained and there is no dependance on dopant outdiffusion to guarantee overlap of the vertical gate oxide.

Those skilled in the art will appreciate that the inventive method may be used for connections in other circuits than DRAMs. Many suggestions have been made in the art for three-dimensional stacking of transistors and other devices, which may benefit for the ability to make a connection through the substrate or other dielectric material from a lower electrode to an upper one that is displaced horizontally outside whatever structure holds the lower electrode.

In addition, a conductive path into the substrate, vertically upward and then back in to the substrate can be provided by repeating the steps of stripping the spacer, depositing a temporary oxide layer and then forming a second spacer. Once the second spacer is stripped, the aperture sidewalls above the oxide layer will be doped by the diffusion, forming a conductive path from the upper portion of the aperture and a circuit element that may be placed there downward through the substrate to the lower contact 210.

While the invention has been described in terms of a single preferred embodiment, those skilled in the art will recognize that the invention can be practiced in various versions within the spirit and scope of the following claims.

What is claimed is:

1. A method of making an electrical connection between a lower electrical contact formed in a semiconductor substrate at a first depth below a surface of said substrate and an electrode of a circuit element formed at a second depth less than said first depth, comprising the steps of:

forming said lower electrical contact in an aperture formed in said semiconductor substrate and having a vertical aperture axis and aperture sidewalls;

depositing a temporary layer above said lower electrical contact and having a first length along said vertical axis;

forming a vertical spacer on the aperture sidewalls above said temporary layer;

stripping said temporary layer, thereby exposing the aperture sidewalls below said vertical spacer in a diffusion window;

diffusing dopant into the substrate through said diffusion window, thereby forming a conductive path vertically from said lower electrical contact to a portion of said substrate adjacent to said vertical spacer; and forming said circuit element with said portion of said substrate adjacent to said vertical spacer as said lower electrode.

2. A method according to claim 1, further comprising a step of depositing an insulating layer above said lower electrode after said step of diffusing dopant.

3. A method according to claim 2, further comprising a step of stripping said spacer, thereby exposing said substrate walls above said insulating layer.

4. A method according to claim 3, in which said diffusion window has a vertical extent and said insulating layer has a thickness less than said vertical extent, whereby substrate walls exposed above said insulating layer are doped; and forming said circuit element in said aperture, said circuit element being connected to said lower electrode through said conductive path.

5. A method according to claim 1, in which said circuit element is the pass transistor of a DRAM cell, said lower electrical contact is the capacitor contact of said DRAM cell and said vertical transistor body is formed adjacent to said vertical spacer, whereby dopant diffused through said diffusion window forms a self-aligned conductive path between said lower electrode and said transistor body.

6. A method according to claim 1, in which said lower electrical contact is a capacitor electrode; and further comprising the step of stripping said vertical spacer on the aperture walls forming the transistor gate insulator on said aperture walls and then forming the upper portion of a DRAM cell containing said capacitor.

7. A method according to claim 6, further comprising a step of depositing an insulating layer above said lower electrode after said step of diffusing dopant and before said step of stripping said vertical spacer, whereby said insulating layer isolates said capacitor from said upper portion of a DRAM cell.

8. A method according to claim 4, in which said circuit element is an interconnection member connected to at least one additional component of an integrated circuit.

9. A method according to claim 8, in which said substrate comprises a device layer disposed above an insulating layer and said circuit element is a vertical interconnection member extending vertically through said insulating layer and connected to at least one additional component of an integrated circuit.

10. A method according to claim 9, in which said device layer comprises silicon, said insulating layer comprises silicon oxide and said substrate comprises silicon.

* * * * *